(12) United States Patent
Wallner et al.

(10) Patent No.: US 7,325,152 B2
(45) Date of Patent: Jan. 29, 2008

(54) SYNCHRONOUS SIGNAL GENERATOR

(75) Inventors: Paul Wallner, Prien (DE); Peter Gregorius, Munich (DE)

(73) Assignee: Infineon Technologies AG, Munich (DE)

( * ) Notice: Subject to any disclaimer, the term of this patent is extended or adjusted under 35 U.S.C. 154(b) by 373 days.

(21) Appl. No.: 11/170,887

(22) Filed: Jun. 30, 2005

(65) Prior Publication Data

US 2007/0006010 A1    Jan. 4, 2007

(51) Int. Cl.
*G06F 1/04* (2006.01)

(52) U.S. Cl. ............... 713/401; 713/400; 713/500; 713/501; 713/502; 713/503; 713/600; 713/601

(58) Field of Classification Search ........ 713/400–401, 713/500–503, 600–601
See application file for complete search history.

(56) References Cited

U.S. PATENT DOCUMENTS

| | | | | |
|---|---|---|---|---|
| 5,396,377 A | * | 3/1995 | Yang | .................. 360/51 |
| 5,781,500 A | * | 7/1998 | Oh | .................. 365/233 |
| 6,060,928 A | * | 5/2000 | Jun et al. | .............. 327/261 |
| 6,292,182 B1 | * | 9/2001 | Park et al. | .............. 345/211 |
| 6,304,979 B1 | * | 10/2001 | Bacigalupo | ............ 713/601 |
| 6,707,723 B2 | * | 3/2004 | Jeong | ............ 365/189.05 |
| 2004/0223565 A1 | * | 11/2004 | Adkisson | .............. 375/354 |

* cited by examiner

*Primary Examiner*—A. Elamin
(74) *Attorney, Agent, or Firm*—Dick, Billig & Czaja, PLLC (57) ABSTRACT

A synchronous signal generator is provided that contains a first and second counting and delay circuit, which both are in a subhierarchical position with respect to a reset signal synchronization/delay circuit. The reset signal synchronization/delay circuit and the first and second counting and delay circuit are triggered by a basic clock signal or a first clock signal derived therefrom to be identical in frequency and phase, and contain counting means whose initial and final counting state are adjustable in order to set, in a clocked fashion, the temporal positions of a first and second load signal that are output by the first counting and delay circuit as well as of a FIFO read clock signal that is output by the second counting and delay circuit and thus adapt them to the temporal requirements of a semiconductor memory system containing the synchronous signal generator.

20 Claims, 4 Drawing Sheets

SYNCHRONOUS SIGNAL GENERATOR

BACKGROUND

The present invention relates to the field of data transmission between fast memory components, and between the memory components and a memory control unit and, more particularly, the field of generating synchronous control signals for a parallel/serial converter that converts parallel send data in a memory interface circuit to a serial send data stream.

The transmission of data between semiconductor memory components of the existing generation proceeds at a relatively low transmission rate using a bidirectional low-speed bus with separated ports for data, addresses and commands, and send interface circuits performing a serial data transmission at the very high transmission rates of future memory generations do not currently exist.

The future memory generations, for example, of DDR-DRAM memories, will have very high transmission frequencies and be subject to a variety of limitations: the send interface circuit of future semiconductor memories of this type is to have, on the one hand, low power consumption and, on the other hand, transmit the data at the required high transmission frequencies so that there exists a tradeoff between high transmission frequencies, that is, higher power consumption and the need to reduce power consumption to avoid overheating or increase battery life time in mobile applications.

For this purpose, a signal generator for synchronous generation of the clock and control signals employed in the send interface circuits of future semiconductor memory generations is required that is equipped to adjust the temporal position of these clock and control signals to the individual system requirements and optionally shall be able to switch off the send interface during times when there is no data sending required.

SUMMARY

One embodiment of the present invention achieves a synchronous signal generator adapted for generating and outputting a first and second load signal and a FIFO read clock signal that are suitable to control a parallel/serial converter implemented in a send interface circuit, the temporal positions of said signals can be adjusted to existing system requirements.

One embodiment of the invention provides a synchronous signal generator with a first and second clocked counting and delay circuit. Each circuit is configured for generating and outputting a first and second load signal, and a FIFO read clock signal, each synchronous and in phase with a periodic basic clock signal input into it, at an adjustable and basic clock pulse-synchronous time point after a reset signal that is synchronized with the basic clock signal. The first counting and delay circuit counts, based on the basic clock pulse, in an edge-triggered fashion a certain or adjustable number of clock pulse periods of the basic clock signal from the time point of reception of the synchronized reset signal, generates an initial load signal upon reaching a certain or adjustable counting value, and outputs the initial load signal delayed by half a period of the basic clock signal as the first load signal and delayed by a full period of the basic clock signal as the second load signal. The second counting and delay circuit delays, based on the basic clock signal, in an edge-triggered fashion the FIFO read clock signal by a certain or adjustable integral multiple of half of the clock period of the basic clock signal from the time of reception of the synchronized reset signal and outputs it phase-locked to the first and second load signal.

In this synchronous signal generator according to one embodiment of the invention, the temporal position of the first and second load signal, which are in a fixed phase relationship with respect to each other, can be determined or adjusted by means of the first counting and delay circuit in steps that are determined by the period of the basic clock signal relative to the temporal position of the clock signal-synchronized reset signal, and also the temporal position of the FIFO read clock signal can be determined or adjusted by means of the second counting and delay circuit in steps that are determined by half of the clock pulse period of the basic clock signal relative to the temporal position of the clock signal-synchronized reset signal, whereby the first and second load signal in any case are generated and output such as to be phase-locked to the FIFO read clock signal.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One embodiment of the first and second counting and delay circuit includes a synchronous n-value counter that is triggered by each front edge of the basic clock signal and generates the initial load signal starting at a certain or adjustable counting value to have a pulse duty factor of 1:4 and a periodicity of four cycles of the basic clock signal. The first and second counting and delay circuit also includes a first delay flip-flop that receives the initial load signal and, triggered by the rear edge of the basic clock signal, outputs it delayed by half of a clock period thereof as the first load signal. The first and second counting and delay circuit also includes a second delay flip-flop downstream from the first delay flip-flop that receives the first load signal and, triggered by the front edge of the basic clock signal, outputs it delayed by a half of a clock period thereof as the second load signal.

Here, the adjustment of the temporal position of the first and second load signal is reduced to the design or setting of the n-value counter with two options being available: the n-value counter can either be set to a defined initial counting value upon reception of the synchronized reset signal or it outputs the initial load signal it generates when a certain or adjustable counting value is reached.

In one case, the n-value counter is a 4-value counter

According to one embodiment, the second counting and delay circuit is set-up such that it generates the FIFO read clock signal in a phase-locked fashion to have a periodicity equaling four clock pulse periods of the basic clock signal and a pulse duty factor of 1:2.

In one embodiment, the synchronous signal generator also includes a reset signal synchronization/delay circuit that receives an external asynchronous reset signal, a FIFO write clock signal, and the basic clock signal, and generates the synchronized reset signal upon the first front edge of the FIFO write clock signal following the asynchronous reset signal such that it is synchronous to the basic clock signal and delayed with respect to the front edge of the FIFO write clock signal by a certain or adjustable integral multiple, including zero, of one half of the clock period of the basic clock signal, whereby the FIFO write clock signal has a pulse duty factor of 1:2 and a period of four clock pulse periods of the basic clock signal and is shifted in phase with respect to the FIFO read clock signal by an integral multiple of one half of a clock pulse period of the basic clock signal.

The second counting and delay circuit generates, as a function of the synchronized reset signal generated by and supplied from the reset signal synchronization/delay circuit, the FIFO read clock signal such that its front edge is at least one half of a clock pulse period of the basic clock signal after the front edge of the FIFO write clock signal and at least one half of a clock pulse period of the basic clock signal before the rear edge of the FIFO write clock signal. In general it is assumed that the FIFO read clock signal and the FIFO write clock signal belong to diferent clock domains. The present FIFO is used to adjust memory's latency accurately and/or align different clock domains. If the FIFO write clock signal comes along with the read data from the memory cove, it is not required to be periodical.

In one embodiment, the signals generated by the synchronous signal generator namely the first and second load signal and the FIFO read clock signal, are each 1-bit signals.

One embodiment of the invention indicates the utilization of this synchronous signal generator for a synchronous parallel/serial converter for the parallel/serial conversion of send data signals to be sent by a send interface circuit of a DRAM memory chip or memory controller. This parallel/serial converter includes a FIFO register that receives a parallel send data signal and splits it synchronous to the basic clock signal and as a function of the FIFO read clock signal into an even-numbered and an odd-numbered portion.

The parallel/serial converter also includes a first shift register that converts the even-numbered portion of the parallel send data signal as a function of the first load signal and synchronous either to the front or back edge of the basic clock signal into a first serial send data stream. The parallel/serial converter also includes a second shift register that converts the odd-numbered portion of the parallel send data signal as a function of the second load signal synchronous to the corresponding other edge, that is, either synchronous to the back or front edge, of the basic clock signal into a second serial send data stream, and a joining unit that joins the first send data stream and the second send data stream synchronous to the back or front edge of the basic clock signal to form a serial one-bit send data stream.

In particular, a parallel/serial converter of this type, in which the synchronous signal generator according to one embodiment of the invention is applied, is set-up for parallel/serial conversion of an 8 bit-wide send data signal, whereby the first and second shift register each are implemented in the form of a 4:1 shift register.

Figure 1:
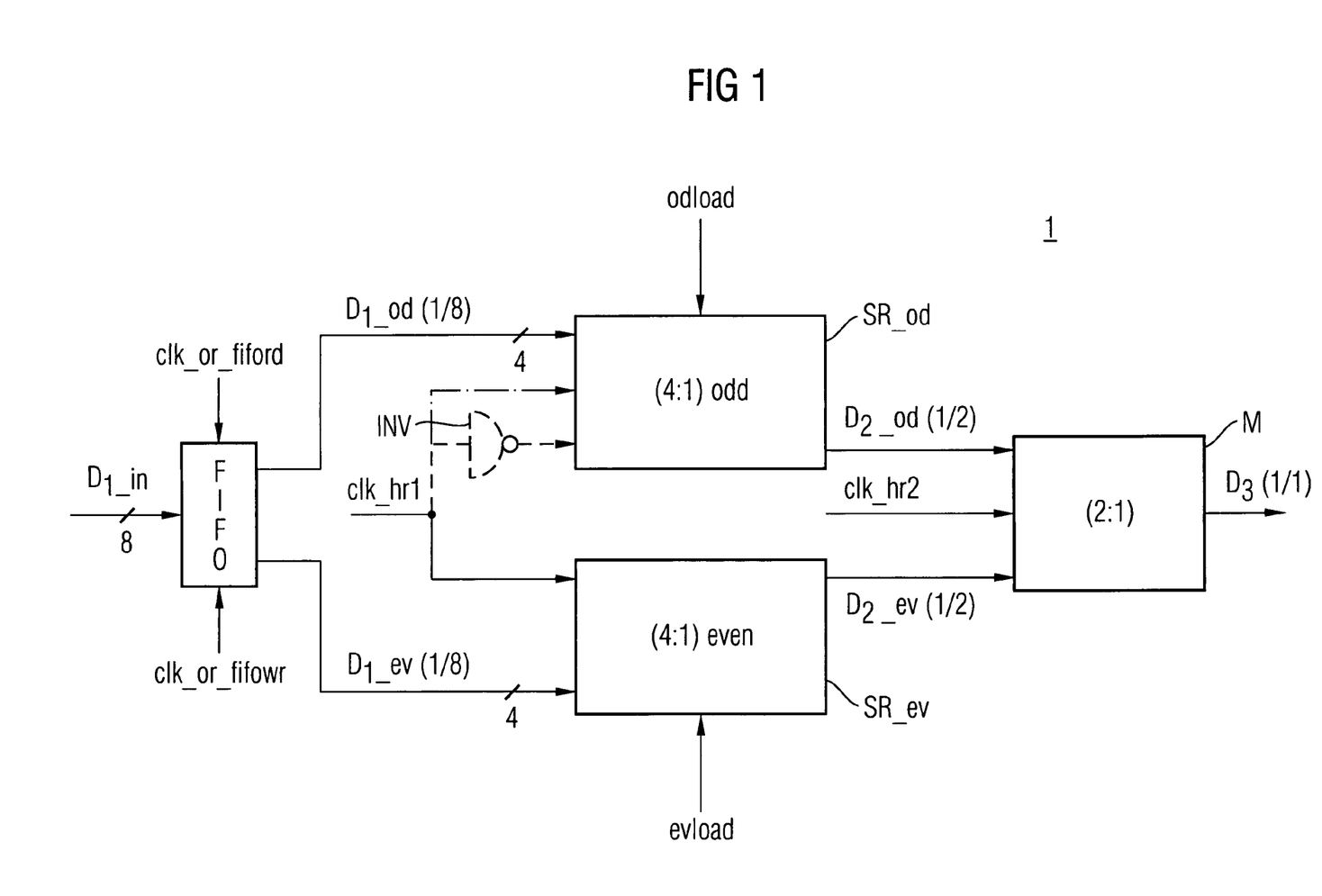
FIG. 1 illustrates a functional block diagram of a synchronous parallel/serial converter designed as a section of a send interface circuit of a DRAM.
Figure 2:
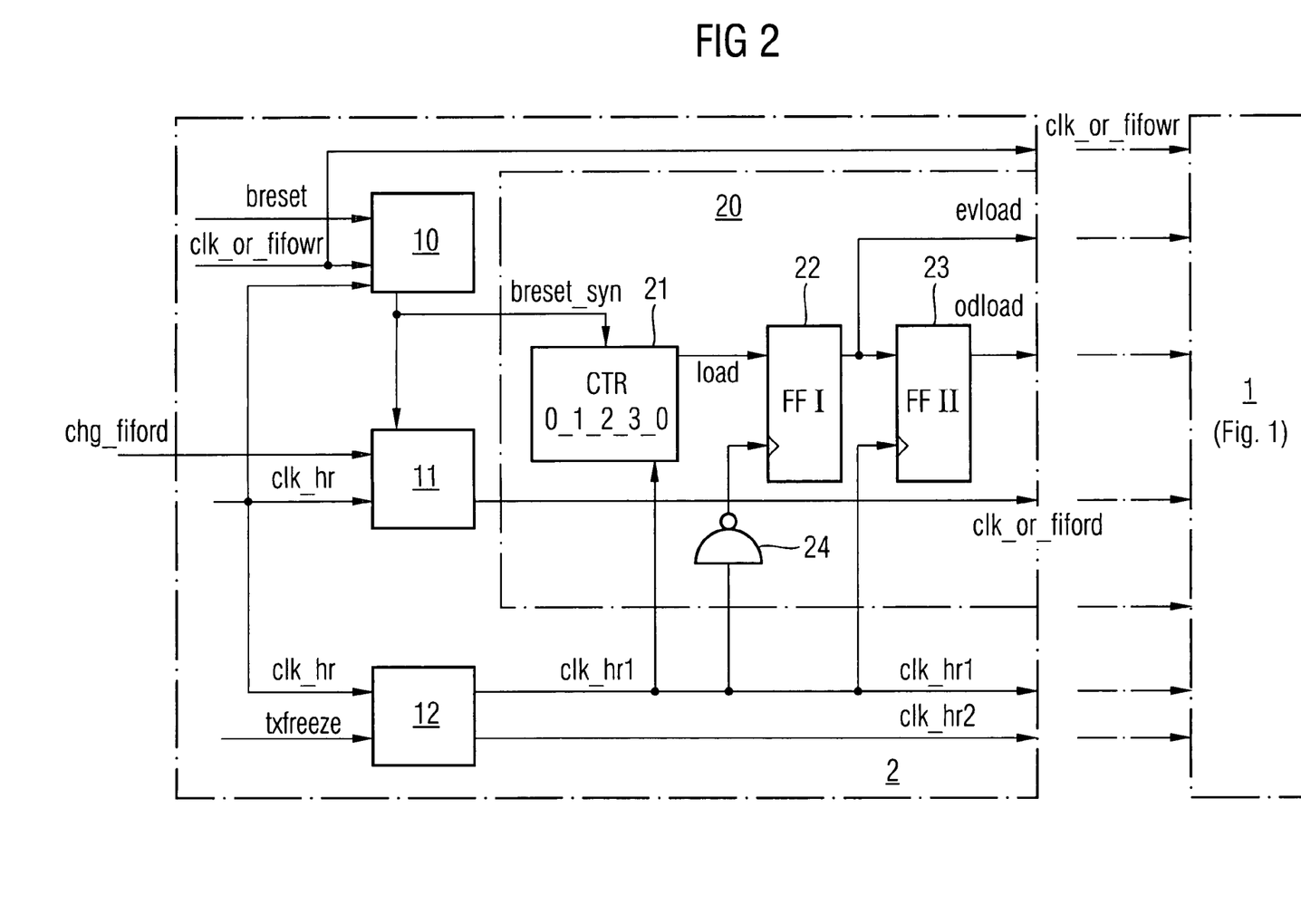
FIG. 2 illustrates a functional block diagram of a synchronous signal generator according to one embodiment of the invention.
Figure 3:
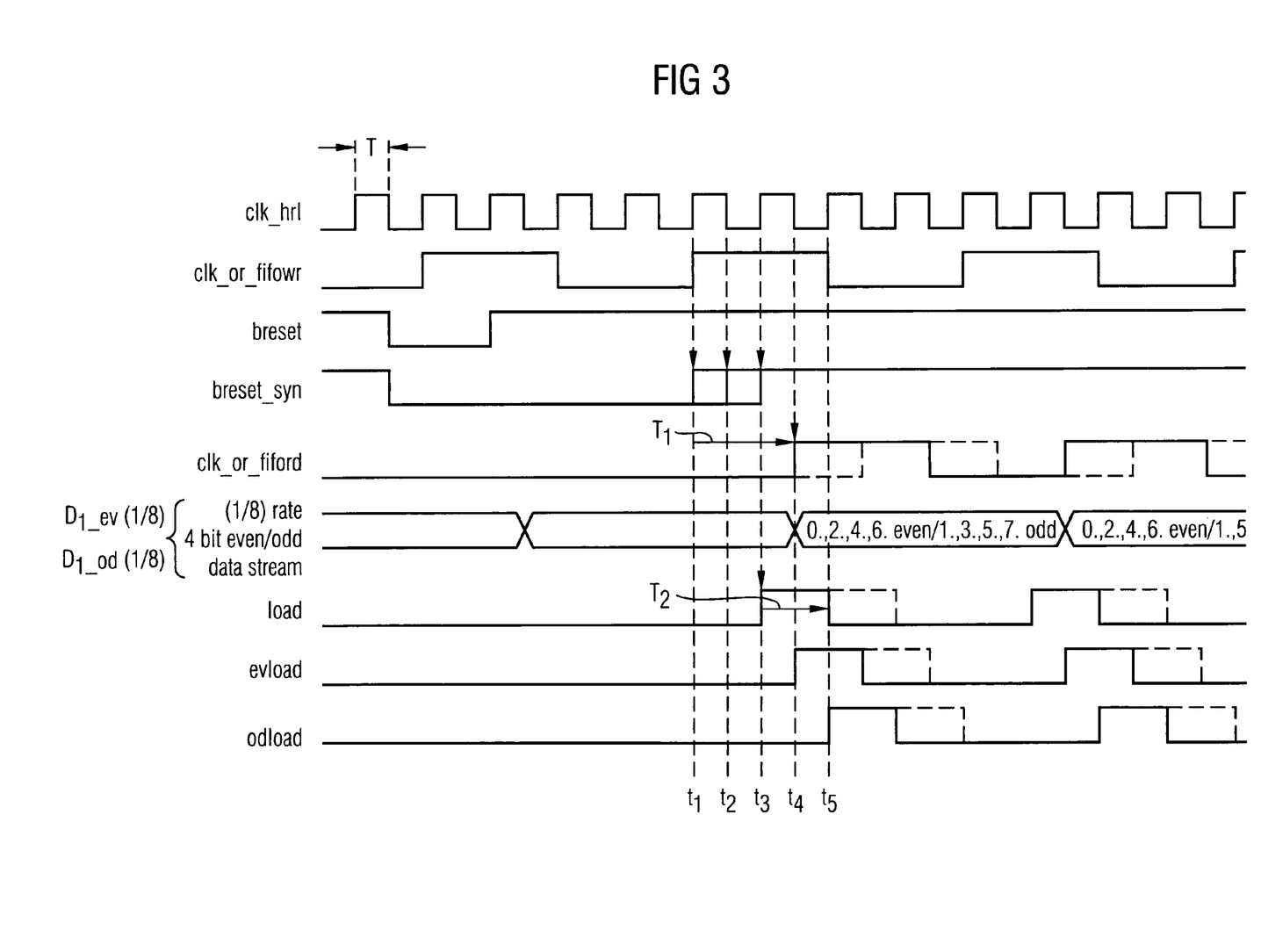
FIG. 3 illustrates graphical signal-time diagrams for illustration of functions and embodiments of the synchronous signal generator illustrated in FIG. 2.
Figure 4:
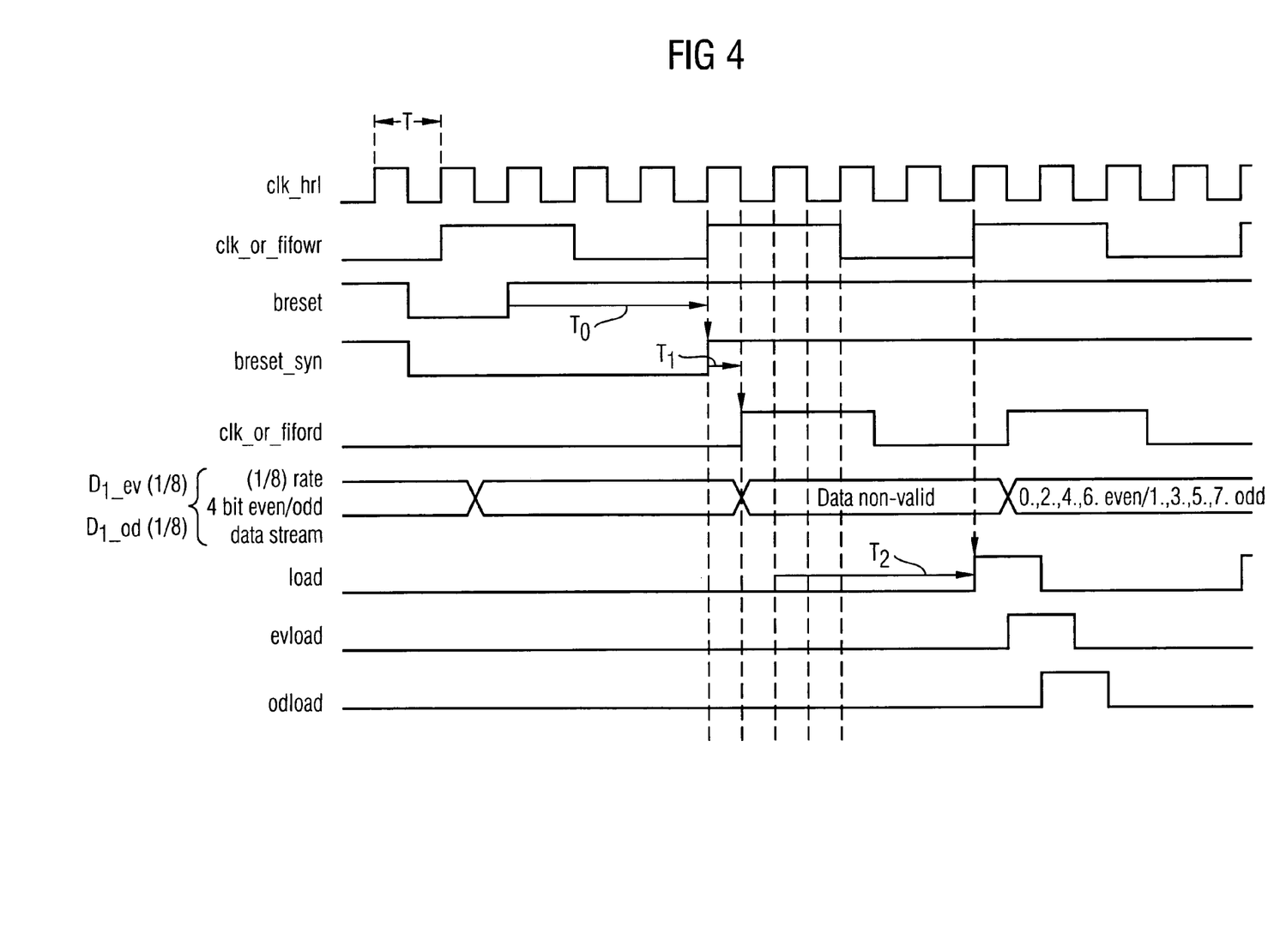
FIG. 4 illustrates graphical signal-time diagrams of a functional refinement of the synchronous signal generator illustrated in FIG. 2.

Prior to illustrating the details and functions of a synchronous signal generator according to one embodiment of the invention based on FIGS. 2 to 4, a functional block diagram of a synchronous parallel/serial converter designed as a section of a send interface circuit of a DRAM memory is illustrated referring to FIG. 1.

The parallel/serial converter 1 illustrated in FIG. 1 includes a FIFO register FIFO, a first (4:1) shift register SR_ev, a second (4:1) shift register SR_od, and one (2:1) joining unit M. An 8-bit parallel send data signal D1_in arrives at the FIFI register FIFO that is upstream from the first shift register SR_ev and the second shift register SR_od, and is then written into the FIFO register FIFO at a FIFO write clock signal clk_or_fifowr. The FIFO register FIFO splits the supplied 8 bit-wide send data signal D1_in into an even-numbered portion D1_ev (1/8) and an odd-numbered portion D1_od (1/8). For this purpose, a read clock signal clk_or_fiford is supplied to the FIFO register FIFO in addition to the write clock signal clk_or_fifiwr. The FIFO read clock signal clk_or_fiford is synchronous to a basic clock signal clk_hr (not shown here) and has in one case a pulse duty factor of 1:2 and a quarter of the frequency of the basic clock signal clk_hr.

For clocking the first and second shift registers SR_ev and SR_od, a clock signal clk_hr1 of identical frequency and phase are derived from the basic clock signal and applied to the first shift register SR_ev and to the second shift register SR_od in non-inverted form and in inverted form, respectively. Moreover, a second clock signal clk_hr2 with identical phase and frequency as the basic clock signal is also applied to the joining unit M. The first shift register SR_ev converts the even-numbered portion D1_ev (1/8) of the parallel send data signal applied to it, in the form output by the FIFO register FIFO, as a function of a first load signal evload, such as to be synchronous to either the front or the back edge of the non-inverted first clock signal clk_hr1 into a first serial send data stream D2_ev (1/2), whereas the second shift register SR_od converts the odd-numbered portion D1_od (1/8) of the parallel send data signal supplied by the FIFO register FIFO, as a function of a second load signal odload, such as to be synchronous to the corresponding other edge of the first clock signal clk_hr1 into a second serial send data stream D2_od (1/2). The joining unit M receives from the first and second shift registers SR_ev and SR_od the corresponding first and second serial send data streams D2_ev (1/2) and D2_od (1/2) and converts them synchronous to the back edge or front edge of the second clock signal clk_hr2 into a serial one-bit output data stream D3 (1/1). It shall be noted in this context that the basic clock signal clk_hr (not shown) and the first and second clock signal clk_hr1 and clk_hr2 derived from it with the same frequency and phase each have half of the clock pulse frequency of a system clock pulse (not shown), which in the context of the present description is only virtual, and that the reason for splitting into the first clock signal clk_hr1 and the second clock signal clk_hr2 is that the synchronous signal generator described below is provided with means for shutting off the second clock signal clk_hr2 upon reception of an external shut-off signal and thus prevent the output of the serial data stream D3 (1/1).

FIG. 1 includes an inverter element INV illustrated by dashes for inverting the first clock signal clk_hr1 supplied to the second shift register SR_od, and this inverter element INV is dispensable, provided the first clock signal is supplied in the form of a differential clock signal. This is indicated by the signal profile of the first clock signal clk_hr1 illustrated by a dot-dash line in FIG. 1.

The following description explains one embodiment of a synchronous signal generator with a first and second clocked counting and delay circuit each for generating and outputting:

(a) the first and second load signal evload and odload (first and second counting and delay circuit), as well as (b) the FIFO read clock signal clk_or_fiford, synchronous and in phase with the periodic basic clock signal clk_hr supplied to it and at an adjustable and basic clock pulse-synchronous time point after a reset signal breset_syn that is synchronized with the basic clock signal clk_hr (second counting and delay circuit), whereby the first counting and delay circuit counts, based on the basic clock pulse clk_hr, in an edge-triggered fashion a certain or adjustable number of clock pulse periods of the basic clock signal clk_hr from the time of reception of the synchronized reset signal breset_syn, generates an initial load signal upon reaching a certain or adjustable counting value, and outputs the initial load signal delayed by half a period of the basic clock signal as the first load signal evload and delayed by a full period of the basic clock signal as the second load signal odload, and the second counting and delay circuit delays, based on the basic clock signal clk_hr, in an edge-triggered fashion the FIFO read clock signal clk_or_fiford by a certain or adjustable integral multiple of one half of the clock period of the basic clock signal clk_hr from the time of reception of the synchronized reset signal breset_syn and outputs it phase-locked to the first and second load signal evload/odload.

FIG. 2 illustrates a functional block diagram of the synchronous signal generator according to one embodiment of the invention, which in general is denoted by reference number 2. The units contained in this synchronous signal generator, namely a reset signal synchronization/delay circuit 10, a second counting and delay circuit 11, a clock signal splitter/shut-off circuit 12, and a first counting and delay circuit 20, in the order given, form a subhierarchy. The reset signal synchronization/delay circuit 10 receives an external asynchronous reset signal breset and a FIFO write clock signal clk_or_fifowr (see description of FIG. 1 above) and also the basic clock signal clk_hr and is equipped to synchronize the supplied asynchronous reset signal breset through the use of the FIFO write signal clk_or_fifowr to generate a synchronized reset signal breset_syn. Accordingly, the reset signal synchronization/delay circuit 10 generates the synchronized reset signal breset_syn upon the first front edge of the FIFO write clock signal clk_or_fifowr arriving after the asynchronous reset signal breset such as to be synchronous with the basic clock signal clk_hr and delayed by a certain or adjustable integral multiple including zero of one half of the clock pulse period of the basic clock signal with respect to that front edge of the FIFO write clock signal clk_or_fifowr. As mentioned, the FIFO write clock signal clk_or_fifowr in one case has a pulse duty factor of 1:2 and a periodicity of four clock pulse periods of the basic clock signal clk_hr.

The second counting and delay circuit 11 is clocked by the basic clock signal clk_hr and receives the synchronized reset signal breset_syn and generates therefrom the FIFO read clock signal clk_or_fiford such as to be synchronous with the basic clock signal clk_hr. Like the FIFO write clock signal, the FIFO read clock signal clk_or_fiford has in one case a pulse duty factor of 1:2 and a periodicity of four clock pulse periods of the basic clock signal clk_hr, and the second counting and delay circuit 11 generates the FIFO read clock signal clk_or_fiford to have a phase that is delayed by an integral multiple of half of a clock pulse period of the basic clock signal clk_hr with respect to the phase of the FIFO write clock signal clk_or_fifowr. A pulse duty factor of 1:2 for clk_or_fiford and clk_or_fifowr is used in one case, but in reality not always easy to generate accurately.

The first counting and delay circuit 20 is edge-triggered by the first clock signal clk_hr1, which is derived by unit 12 from the basic clock signal clk_hr such as to be identical in frequency and phase, and also receives the synchronized reset signal breset_syn from the reset signal synchronization/delay circuit 10 described above. The first counting and delay circuit 20 contains a synchronous n-value counter CTR 21, which is in one case a 4-value counter, triggered by the front edge of the first clock signal clk_hr1, for generating an initial load signal "load" at a certain or adjustable counting value, which initial load signal load has a pulse duty factor of 1:4 and a periodicity of four cycles of the basic clock signal. The first counting and delay circuit 20 includes moreover a first delay flip-flop FFI 22 and a second delay flip-flop FFII 23. FFI 22 receives the initial load signal load from CTR 23 and, triggered by the rear edge of the first clock signal clk_hr1, outputs it delayed by half of a clock pulse period with respect to the initial load signal load as the first load signal evload. The second delay flip-flop FFII 23 is arranged downstream from FFI 22 and is triggered by the front edge of the first clock signal clk_hr1 and outputs the second load signal odload delayed by half of a clock pulse period with respect to the first load signal evload.

As mentioned above, CTR 21 is an n-value, in one case a 4-value counter which, triggered by the front edge of the first clock signal clk_hr1, counts the values 0, 1, 2, 3, 0, ... (or 3, 2, 1, 0, 3, ...) and outputs the initial load signal "load" at the output terminal when a certain counting value is reached. For example, this counting value leading to the initial load signal "load" could be the value 0. As mentioned before, for a different frequency ratio of clk_hr and clk_or_fiford a different counter maximum value occurs. Overall goal is only to provide for each data packet a single load signal considering certain other boundary conditions.

Based on FIG. 3, which illustrates a signal-time diagram of the signals (from top to bottom in FIG. 3): first clock signal clk_hr1, FIFO write clock signal clk_or_fifowr, asynchronous reset signal breset, synchronized reset signal breset_syn, FIFO read clock signal clk_or_fiford, even-numbered/odd-numbered send data signal D1_ev (1/8), D1_od (1/8), initial load signal load, first load signal evload, and second load signal odload, various options for setting or adjusting the temporal positions:

1) of the initial load signal load and thus also of the first load signal evload and second load signal odload;

2) of the synchronized reset signal breset_syn; and 3) of the FIFO read clock signal clk_or_fiford, which are phase-locked to the first clock signal clk_hr1, are illustrated.

The FIFO write clock signal clk_or_fifowr has in general no fired phase correlation to the clk_hr and FIFO read clock domain, even if FIGS. 3 and 4 seem to illustrate this.

The first case to be described is case 1).

As mentioned, CTR 21 commences from the front edge of the synchronized reset signal breset_syn to count the first clock signal clk_hr1 and, for this purpose, can be set to a certain/adjustable initial counting value by the synchronized reset signal breset_syn. Since CTR 21 can count maximally four values, it counts four front edges of the first clock signal clk_hr1 and then starts anew. Five time points, t1, t2, t3, t4, and t5, each shifted by half a clock pulse period T/2 of the first clock signal clk_hr1, are drawn in FIG. 3. If the front edge of the synchronized reset signal breset_syn occurs, for example, at time point t1, CTR 21 can output the initial load signal load for the first time upon the next front edge of the first clock signal clk_hr1, that is, at time point t3, or it can output load as well at the second to next front edge of the first clock signal clk_hr1, that is, at time point t5. This means that, depending on the design or setting of CTR 21, maximally four temporal positions are possible for the initial load signal load, each at a temporal distance of one period T of the first clock signal clk_hr1, of which two possible positions (dashed lines) are drawn in FIG. 3. As illustrated, FFI 22 then delays this initial load signal by half of a clock pulse period T/2 to generate the first load signal evload, and this is then delayed again by FFII 23 by half of a clock pulse period T/2 of the first clock signal clk_hr1 and provides the second load signal odload. A design, in which CTR 21 outputs the initial load signal load at a counting value of "0," serves exemplary purposes only. Alternatively, CTR 21 could be set to the initial counting value 3 by the synchronized reset signal breset_syn, and the counting value determining the generation of the initial load signal load could be the value, 1. Other combinations of initial counting value and final counting value of CRT 21 are also possible.

Referring to case 2), FIG. 3 illustrates the option to set the temporal position of the synchronized reset signal breset_syn front edge of the FIFO write clock signal clk_or_fifowr by means of the reset signal synchronization/delay circuit 10. As illustrated in FIG. 3, the reset signal synchronization/delay circuit 10 can place or set the temporal position of the synchronized reset signal breset_syn, for example, at or to the time points, t1, t2, t3, that is, in steps of half of a clock pulse period of the first clock signal clk_hr1, such that CTR 21 can, as before, generate the temporal position of the initial load signal load relative to the temporal position of the synchronized reset signal breset_syn.

Referring to case 3), FIG. 3 illustrates that the second counting and delay circuit 11 delays the FIFO read clock signal clk_or_fiford by a time period T1, which corresponds to a certain or adjustable integral multiple of half of the clock pulse period T/2 of the first clock signal clk_hr1, with respect to the time point, that is, t1, of reception of the synchronized reset signal breset_syn that is synchronized with the first clock signal clk_hr1. In an exemplary fashion, FIG. 3 illustrates two possible cases, namely that the temporal position of the FIFO read clock signal clk_or_fiford, represented in an exemplary fashion by the time period T1, is generated and delayed by 1.5 T (illustrated by a continuous line) or 2.5 T, as illustrated by a dashed line, respectively, with respect to the front edge of the synchronized reset signal breset_syn. However, when determining or setting the temporal position of the FIFO read clock signal clk_or_fiford it must be noted to ensure that it is generated and output such as to be phase-locked with the first and second load signal evload and odload.

FIG. 4 illustrates a further measure for adjusting the temporal positions of the initial load signal load and the first and second load signal evload and odload by the first counting and delay circuit 20, that is, in each case by CTR 21, FFI 22, and FFII 23, and, in this context, the setting of the temporal position of the FIFO read clock signal clk_or_fiford by the second counting and delay circuit 11.

As illustrated by FIG. 4, the temporal position (illustrated by T1) of the first FIFO read clock signal clk_or_fiford is delayed by half of a clock pulse period T/2 of the first clock signal clk_hr1 with respect to the front edge of the synchronized reset signal breset_syn by the second counting and delay circuit 11. Now, if it is being considered or determined that the send data that are directly read out from the FIFO (compare FIG. 1) by the first FIFO read clock pulse are invalid, the temporal positions of the initial load signal load, first load signal evload and second load signal odload, as illustrated in FIG. 4, can, in order to meet certain time requirements, be placed by the first counting and delay circuit 20, that is, by CTR 21, such that, compared to the case illustrated in FIG. 3, the temporal position of the load signals, load, evload, and odload, which are first generated after the synchronized reset signal breset_syn, are delayed by a full cycle of the FIFO read clock signal clk_or-fiford. As has been illustrated above, this can be achieved by means of setting the initial counting value of CTR 21 accordingly. As a result, the FIFO read clock signal clk_or_fiford and the first and second load signal evload and odload have the correct and time requirement-meeting temporal positions with respect to each other and to the even-numbered and odd-numbered portion of the send data signals D1_ev and D1_od.

Referring to FIG. 2 again, the additional circuit block 12, which outputs the first clock signal clk_hr1 and the second clock signal clk_hr2, serves to shut-off the latter upon an external shut-off signal txfreeze.

The second counting and delay circuit 11 can receive an external static setting signal chg_fiford by means of which an internal counter of the second counting and delay circuit 11 and thus, as has been discussed above, the temporal position of the FIFO read clock signal clk_or_fiford, can be set. In addition, it shall also be mentioned that the signals generated and output by the present synchronous signal generator, that is, the FIFO read clock signal clk_or_fiford, the first and second load signal evload and odload, and the first and second clock signal clk_hr1 and clk_hr2, each are one-bit signals. However, these signals can also be output in the form of differential signals in an alternative implementation.

As mentioned in the introduction, the synchronous signal generator described above by referring to FIGS. 2 to 4 is designed to be applied in a synchronous parallel/serial converter 1 such as the one described in the introduction and illustrated in FIG. 1. In order to account for different timing requirements of a semiconductor memory chip and semiconductor memory system equipped with a synchronous parallel/serial converter of this type and a synchronous signal generator according to the invention, the first and second counting and delay circuit 20, 11 and the reset signal synchronization/delay circuit 10 of the present synchronous signal generator comprise means for setting/determining the temporal positions of the first and second load signal evload and odload and of the FIFO read clock signal clk_or_fiford with respect to the synchronized reset signal breset_syn that is synchronized with the first clock signal clk_hr1, whose temporal position with respect to the position of the FIFO write clock signal clk_or_fifowr can be set and/or adjusted by the reset signal synchronization/delay circuit 10. Since the reset signal synchronization/delay circuit 10 and the first and second counting and delay circuit 20, 11 form a subhierarchy, and the synchronized reset signal breset_syn is applied to the two latter and the two latter are edge-triggered by the basic clock signal clk_hr or the first clock signal clk_hr1 derived therefrom, the correct relative temporal positioning of the first and second load signals evload and odload with respect to the FIFO read clock signal clk_or_fiford is ensured.

Due to their high speed, evload and odload signals have very strong timing requirements, that is, must match. Basically, this can be performed very accurately, if the generator blocks of the signals to be matched are identical and rather small. The use of the two identical flip flop circuits FF I 22 and FF II 23 meets to this matching requirements.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A synchronous signal generator comprising:
   a first and second clocked counting and delay circuit;
   wherein each of the first and second clock counting and delay circuits are configured for generating and outputting a first and second load signal, and a FIFO read clock signal, each synchronous and in phase with a periodic basic clock signal input into it, at an adjustable and basic clock pulse-synchronous time point after a reset signal that is synchronized with the basic clock signal;
   wherein the first counting and delay circuit counts, based on the basic clock pulse, in an edge-triggered fashion a number of clock pulse periods of the basic clock signal from the time point of reception of the synchronized reset signal, generates an initial load signal upon reaching a counting value, and outputs the initial load signal delayed by half a period of the basic clock signal as the first load signal and delayed by a full period of the basic clock signal as the second load signal; and
   wherein the second counting and delay circuit delays, based on the basic clock signal, in an edge-triggered fashion the FIFO read clock signal by an integral multiple of half of the clock period of the basic clock signal from the time of reception of the synchronized reset signal and outputs it phase-locked to the first and second load signal.

2. The synchronous signal generator of claim 1, wherein the number of clock pulse periods of the basic clock signal is an adjustable number, wherein the reached counting value is an adjustable counting value, and wherein the delay by the integral multiple is by an adjustable integral multiple.

3. The synchronous signal generator of claim 1, wherein the number of clock pulse periods of the basic clock signal is a certain number, wherein the reached counting value is a certain counting value, and wherein the delay by the integral multiple is by a certain integral multiple.

4. The synchronous signal generator of claim 1, wherein the first counting and delay circuit comprises:
   a synchronous n-value counter that is triggered by each front edge of the basic clock signal and generates the initial load signal starting at a certain or adjustable counting value to have a pulse duty factor of 1:4 and a periodicity of four cycles of the basic clock signal;
   a first delay flip-flop that receives the initial load signal and, triggered by the rear edge of the basic clock signal, outputs it delayed by half of a clock period thereof as the first load signal; and
   a second delay flip-flop downstream from the first delay flip-flop that receives the first load signal and, triggered by the front edge of the basic clock signal, outputs it delayed by a half of a clock period thereof as the second load signal.

5. The synchronous signal generator of claim 1, wherein the second counting and delay circuit generates the FIFO read clock signal in a phase-locked fashion to have a periodicity equaling four clock pulse periods of the basic clock signal and a pulse duty factor of 1:2.

6. The synchronous signal generator of claim 1, further comprising a reset signal synchronization/delay circuit that receives an external asynchronous reset signal, a FIFO write clock signal, and the basic clock signal, and generates the synchronized reset signal upon the first front edge of the FIFO write clock signal following the asynchronous reset signal such that it is synchronous to the basic clock signal and delayed with respect to the front edge of the FIFO write clock signal by a certain or adjustable integral multiple, including zero, of one half of the clock period of the basic clock signal, whereby the FIFO write clock signal has a pulse duty factor of 1:2 and a period of four clock pulse periods of the basic clock signal and is shifted in phase with respect to the FIFO read clock signal by an integral multiple of one half of a clock pulse period of the basic clock signal.

7. The synchronous signal generator of claim 4, wherein the front edge of the FIFO read clock signal is at least one half of a clock pulse period of the basic clock signal after the front edge of the FIFO write clock signal and at least one half of a clock pulse period of the basic clock signal before the rear edge of the FIFO write clock signal.

8. The synchronous signal generator of claim 1, wherein the first and second load signal and the FIFO read clock signal each are 1-bit signals.

9. The synchronous signal generator of claim 1 configured as a synchronous parallel/serial converter for the parallel/serial conversion of send data signals to be sent by a send interface circuit of a DRAM memory chip and further comprising:
   a FIFO register that receives a parallel send data signal and splits it synchronous to the basic clock signal and as a function of the FIFO read clock signal into an even-numbered and an odd-numbered portion;
   a first shift register that converts the even-numbered portion of the parallel send data signal as a function of the first load signal and synchronous either to the front or back edge of the basic clock signal into a first serial send data stream;

a second shift register that converts the odd-numbered portion of the parallel send data signal as a function of the second load signal synchronous to the corresponding other edge; and a joining unit that joins the first send data stream and the second send data stream synchronous to the back or front edge of the basic clock signal to form a serial one-bit send data stream.

10. The synchronous signal generator of claim 9, wherein the parallel send data signal input into the parallel/serial converter is eight bits wide and the first and second shift register each are implemented in the form of a 4:1 shift register.

11. A synchronous signal generator comprising:

first counting and delay means for counting, based on a periodic basic clock signal, in an edge-triggered fashion a number of clock pulse periods of the basic clock signal from the time point of reception of a synchronized reset signal, for generating an initial load signal upon reaching a counting value, and for outputting the initial load signal delayed by half a period of the basic clock signal as a first load signal and delayed by a full period of the basic clock signal as a second load signal; and second counting and delay means for delaying, based on the basic clock signal, in an edge-triggered fashion of FIFO read clock signal by an integral multiple of half of the clock period of the basic clock signal from the time of reception of the synchronized reset signal and for outputting the FIFO read clock signal phase-locked to the first and second load signal;

wherein the first and second load signal and the FIFO read clock signal are each synchronous and in phase with the periodic basic read signal.

12. The synchronous signal generator of claim 11, wherein the number of clock pulse periods of the basic clock signal is an adjustable number, wherein the reached counting value is an adjustable counting value, and wherein the delay by the integral multiple is by an adjustable integral multiple.

13. The synchronous signal generator of claim 11, wherein the number of clock pulse periods of the basic clock signal is a certain number, wherein the reached counting value is a certain counting value, and wherein the delay by the integral multiple is by a certain integral multiple.

14. The synchronous signal generator of claim 11, wherein the first counting and delay means comprises:

a synchronous n-value counter that is triggered by each front edge of the basic clock signal and generates the initial load signal starting at a certain or adjustable counting value to have a pulse duty factor of 1:4 and a periodicity of four cycles of the basic clock signal;

a first delay flip-flop that receives the initial load signal and, triggered by the rear edge of the basic clock signal, outputs it delayed by half of a clock period thereof as the first load signal; and a second delay flip-flop downstream from the first delay flip-flop that receives the first load signal and, triggered by the front edge of the basic clock signal, outputs it delayed by a half of a clock period thereof as the second load signal.

15. The synchronous signal generator of claim 11, wherein the second counting and delay means generates the FIFO read clock signal in a phase-locked fashion to have a periodicity equaling four clock pulse periods of the basic clock signal and a pulse duty factor of 1:2.

16. The synchronous signal generator of claim 11, further comprising a reset signal synchronization/delay circuit that receives an external asynchronous reset signal, a FIFO write clock signal, and the basic clock signal, and generates the synchronized reset signal upon the first front edge of the FIFO write clock signal following the asynchronous reset signal such that it is synchronous to the basic clock signal and delayed with respect to the front edge of the FIFO write clock signal by a certain or adjustable integral multiple, including zero, of one half of the clock period of the basic clock signal, whereby the FIFO write clock signal has a pulse duty factor of 1:2 and a period of four clock pulse periods of the basic clock signal and is shifted in phase with respect to the FIFO read clock signal by an integral multiple of one half of a clock pulse period of the basic clock signal.

17. The synchronous signal generator of claim 14, wherein the front edge of the FIFO read clock signal is at least one half of a clock pulse period of the basic clock signal after the front edge of the FIFO write clock signal and at least one half of a clock pulse period of the basic clock signal before the rear edge of the FIFO write clock signal.

18. The synchronous signal generator of claim 11, wherein the first and second load signal and the FIFO read clock signal each are 1-bit signals.

19. The synchronous signal generator of claim 11 configured as a synchronous parallel/serial converter for the parallel/serial conversion of send data signals to be sent by a send interface circuit of a DRAM memory chip and further comprising:

a FIFO register that receives a parallel send data signal and splits it synchronous to the basic clock signal and as a function of the FIFO read clock signal into an even-numbered and an odd-numbered portion;

a first shift register that converts the even-numbered portion of the parallel send data signal as a function of the first load signal and synchronous either to the front or back edge of the basic clock signal into a first serial send data stream;

a second shift register that converts the odd-numbered portion of the parallel send data signal as a function of the second load signal synchronous to the corresponding other edge; and a joining unit that joins the first send data stream and the second send data stream synchronous to the back or front edge of the basic clock signal to form a serial one-bit send data stream.

20. The synchronous signal generator of claim 19, wherein the parallel send data signal input into the parallel/serial converter is eight bits wide and the first and second shift register each are implemented in the form of a 4:1 shift register.

* * * * *